(12) United States Patent
Fulkerson et al.

(10) Patent No.: US 6,175,525 B1
(45) Date of Patent: Jan. 16, 2001

(54) NON-VOLATILE STORAGE LATCH (75) Inventors: David E. Fulkerson, Chanhasen; Yong Lu, Plymouth; Allen T. Hurst, Jr., Anoka; Jeffrey S. Sather, Medina; Jason B. Gadbois, Minneapolis, all of MN (US)

(73) Assignee: Honeywell Inc., Morristown, NJ (US)

( * ) Notice: Under 35 U.S.C. 154(b), the term of this patent shall be extended for 0 days.

(21) Appl. No.: 09/429,664

(22) Filed: Oct. 28, 1999

Related U.S. Application Data (63) Continuation-in-part of application No. 09/059,871, filed on Apr. 14, 1998.

(51) Int. Cl.[7] .................................................... G11C 7/00
(52) U.S. Cl. .................... 365/189.05; 365/158; 365/171; 365/173
(58) Field of Search ........................... 365/55, 56, 171, 365/173, 185.08, 158, 189.05

(56) References Cited

U.S. PATENT DOCUMENTS

| | | | |
|---|---|---|---|
| 3,573,485 | 4/1971 | Ballard | 307/88 |
| 4,132,904 | 1/1979 | Harari | 307/238 |
| 4,751,677 | 6/1988 | Daughton et al. | 365/158 |
| 4,887,236 | 12/1989 | Schloemann | 365/173 |
| 5,595,830 | 1/1997 | Daughton | 428/611 |
| 5,640,343 | 6/1997 | Gallagher et al. | 365/171 |
| 5,650,887 | 7/1997 | Dovek et al. | 360/75 |
| 5,650,958 | 7/1997 | Gallagher et al. | 365/173 |
| 5,654,566 | 8/1997 | Johnson | 257/295 |
| 5,695,864 | 12/1997 | Slonczewski | 428/212 |
| 5,701,222 | 12/1997 | Gill et al. | 360/113 |
| 5,701,223 | 12/1997 | Fontana, Jr. et al. | 360/113 |
| 5,861,328 | 1/1999 | Tehrani et al. | 438/210 |

FOREIGN PATENT DOCUMENTS

| | | |
|---|---|---|
| 0 776 011 A2 | 5/1997 | (EP) . |
| WO 98/20496 | 5/1998 | (WO) . |

*Primary Examiner*—David Nelms
*Assistant Examiner*—Gene N. Auduong
(74) *Attorney, Agent, or Firm*—Kris T. Fredrick

(57) ABSTRACT

A non-volatile latch having a power supply terminal and a ground terminal is disclosed. The non-volatile latch includes a pair of cross-coupled inverter elements each having a power supply terminal and a ground terminal. Magneto-resistive elements are interposed between the power supply terminals of both cross-coupled inverter elements and the power supply terminal of the non-volatile latch. In addition, magneto-resistive elements are interposed between the ground terminals of both cross-coupled inverter elements and the ground terminal of the non-volatile latch. By including magneto-resistive elements in each supply line, the effects of transistor parameter variation can be minimized.

24 Claims, 4 Drawing Sheets

NON-VOLATILE STORAGE LATCH

This application is a continuation-in-part application of co-pending U.S. patent application Ser. No. 09/059,871, filed Apr. 14, 1998, entitled "Non-Volatile Storage Latch", the entire disclosure of which is incorporated herein by reference.

BACKGROUND OF THE INVENTION

This invention relates to the field of electronic memory devices, and more particularly, to non-volatile memory devices that can assume a desired state when power is applied.

Most digital electronic devices use both logic gates and memory elements to implement a desired function. The memory elements are used to store initial, intermediate and/or final data. The logic gates are used to provide and/or receive the data to/from the memory elements, and perform the necessary data manipulation. In a typical digital system, the basic memory elements are bi-stable logic circuits known as latching elements. There are numerous types of latching elements including, for example, D-latches, RS-latches, JK-latches, etc. These latching elements are often combined to form various forms of flip-flops or other storage devices.

Latching elements typically use one or more feedback paths that have an even number of inversions. By providing an even number of inversions, the feedback path reinforces the data state of the latching element. To write a desired state to the latching element, the feedback path is typically overdriven or a switch is provided to temporarily interrupt the feedback path while a new data state is provided to the latching element. The most basic latching element includes a pair of cross-coupled inverters. There are, however, numerous other known implementations.

A limitation of many conventional latching elements is that the data stored therein is lost when power is lost or otherwise interrupted. For example, when a personal computer or other data processing system loses power, the data stored in the latching elements are lost. When power is restored, the data processing system assumes a state that is unrelated to the state of the data processing system before the power loss. Often, much of the processing that was completed coincident with or prior to the power loss is lost, or must be re-constructed and/or re-executed which can be a time consuming and tedious task.

In high reliability applications, a primary power source and an auxiliary power source may be provided to reduce the likelihood that the latching elements will experience a power loss. In such systems, an auxiliary power source is used when the primary power fails. A limitation of this approach is that significant overhead is required including an auxiliary power source, a power degradation detection mechanism and a power switching mechanism. In addition, the auxiliary power source is often a battery or the like that has a limited lifetime. Therefore, if the primary power source fails for an extended period of time, the auxiliary power source may also fail causing the latching elements to lose the data stored therein.

Another approach for minimizing the loss of data after a power failure is to maintain an audit trail for each transaction submitted to the system. In such a system, an audit trail is periodically written to a non-volatile storage medium such as a magnetic tape or hard drive. The audit trail typically includes a listing of the status of each transaction that is submitted to the processor. If the power fails, the latching elements within the system lose the data stored therein, as described above. However, after power is restored, the audit trail can be used to reconstruct the status of each transaction. Only those transactions that were not completed and stored must be re-submitted for processing. This can significantly reduce the amount of data re-processing required after a power failure. However, significant time and resources are typically required to read the audit trail data and determine the status of each transaction.

It would be desirable, therefore, to provide a latching element that does not lose data when power is lost or otherwise interrupted. This may reduce the need to provide an auxiliary power source and/or audit trail system or the like.

SUMMARY OF THE INVENTION

The present invention overcomes many of the disadvantages of the prior art by providing a bi-stable latching element that assumes a known initial state. The present invention also provides a latching element that does not lose data when power is lost or otherwise interrupted. This is preferably accomplished by incorporating one or more magnetic elements into the latching element. The magnetic elements have at least two stable magneto-resistive states. By programming the magnetic elements to appropriate resistance values, the latching element may assume a desired or known initial state. By programming the magnetic elements each time the latching element is written during normal functional operation, the data stored therein may not be lost when power is lost or otherwise interrupted.

In one illustrative embodiment of the present invention, a non-volatile latch is provided that has a first supply terminal and a second supply terminal. To store a bit of data, the latch preferably includes a first inverting logic element and a second inverting logic element coupled together in a cross-coupled configuration, wherein each of the first and second inverting logic elements has a power supply terminal and a ground terminal. A first magnetic element is then interposed between the power supply terminal of the first inverting logic element and the first supply terminal of the latch. The first magnetic element provides a first magnetically programmable resistance value. A second magnetic element is interposed between the ground terminal of the first inverting logic element and the second supply terminal of the latch. Likewise, a third magnetic element is interposed between the power supply terminal of the second inverting logic element and the first supply terminal of the latch. Finally, a fourth magnetic element is interposed between the ground terminal of the second inverting logic element and the second supply terminal of the latch.

The magnetically programmable resistance value of the first and fourth magnetic elements is preferably programmed to one of the two stable resistive states, and the magnetically programmable resistance values of the second and third magnetic means is preferably programmed to the other one of the two stable states. This configuration provides a maximum imbalance in the latch, and thus provides the most margin for causing the latch to assume a desired initial state.

The first inverting logic element and the second inverting logic element are preferably conventional inverter circuits, each having a p-channel transistor connected in series with an n-channel transistor. Because the difference in resistance between the two stable resistive states of many magneto-resistive elements is relatively small, the variation in transistor parameters of the n-channel and p-channel transistors can significantly effect the margin of the latch in assuming the desired initial state. To minimize the effect of such transistor parameter variations, magnetic elements are preferably placed in series with both the power supply terminal and the ground terminal of each inverting logic element, as described more fully below.

It is also contemplated that a write circuit may be provided for forcing the latch into an intermediate state, and for releasing the latch so that the latch can assume the state dictated by the magnetic elements. The write circuit may include an n-channel transistor that is coupled between the input of the first inverting logic element (the output of the second inverting logic element) and the input of the second inverting logic element (the output of the first inverting logic element). When the n-channel transistor is turned-on, the voltage of the inputs and outputs of the cross-coupled first and second inverting logic elements is forced to be in an intermediate state. When the n-channel transistor is subsequently turned-off, the latch assumes a desired one of two stable states, depending on the resistive states of the magnetic elements. The n-channel transistor, therefore, allows the latch to be written to the state dictated by the resistive states of the magnetic elements without having to power down the latch.

BRIEF DESCRIPTION OF THE DRAWINGS

Other objects of the present invention and many of the attendant advantages of the present invention will be readily appreciated as the same becomes better understood by reference to the following detailed description when considered in connection with the accompanying drawings, in which like reference numerals designate like parts throughout the figures thereof and wherein.

DETAILED DESCRIPTION OF THE PREFERRED EMBODIMENTS

Figure 1:
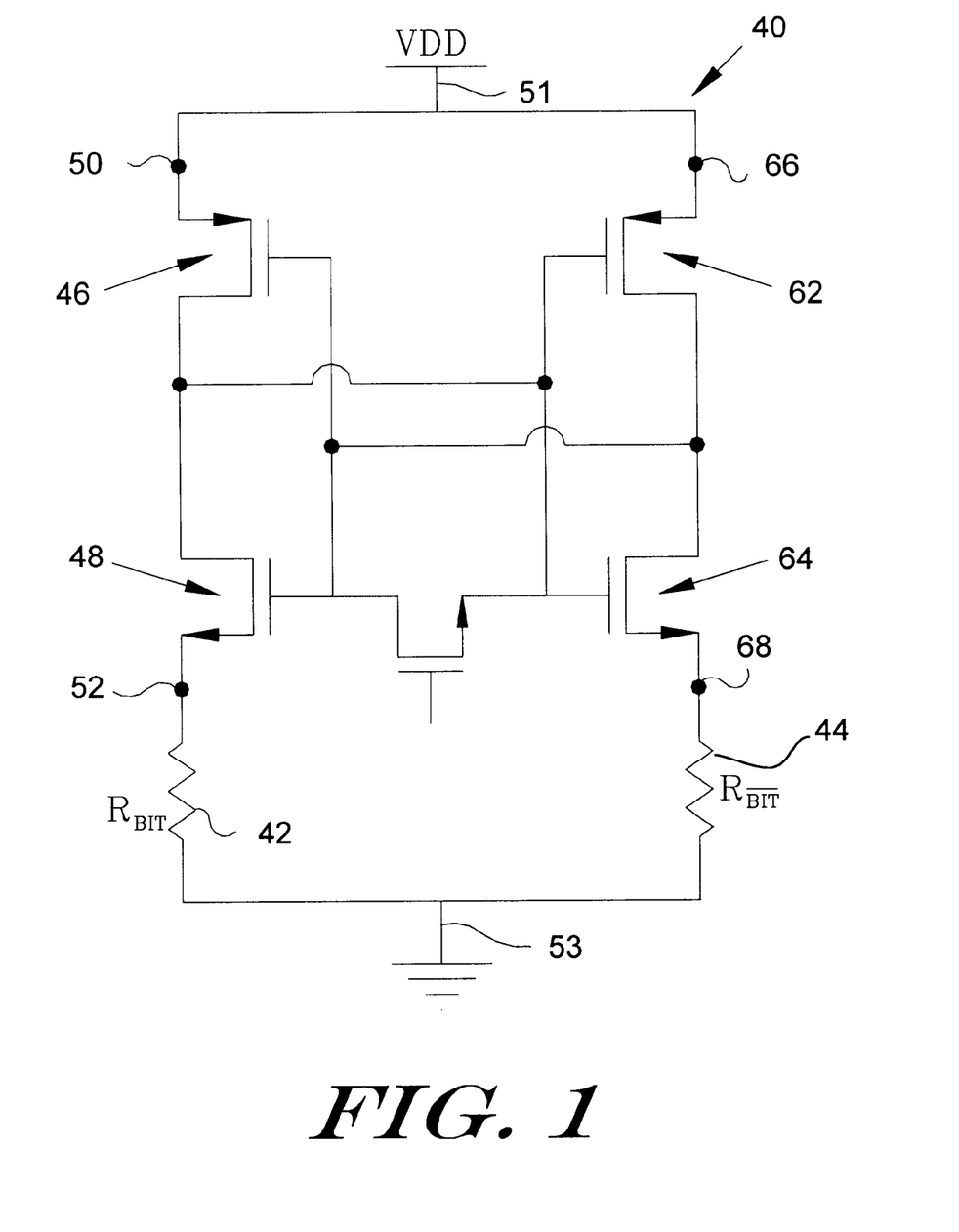
FIG. 1 is a schematic view of a latch element with two magnetic elements therein.

FIG. 1 is a schematic view of a latching element 40 with a first magnetic element 42 and a second magnetic element 44. The latching element 40 includes a first inverter having p-channel transistor 46 and n-channel transistor 48, and a second inverter having p-channel transistor 62 and n-channel transistor 64. The first inverter and the second inverter are coupled together in a well-known cross-coupled configuration as shown.

The first inverter has a first power supply terminal 50 and a second power supply terminal 52. The source of the p-channel transistor 46 is coupled to the first power supply terminal 50, which is coupled directly to a first supply voltage 51. The source of the n-channel transistor 48 is coupled to the second power supply terminal 52. The first magnetic element 42 is disposed between the second power supply terminal 52 and ground 53 (second supply voltage).

Likewise, the second inverter has a first power supply terminal 66 and a second power supply terminal 68. The source of the p-channel transistor 62 is coupled to the first power supply terminal 66, which is coupled directly to the first supply voltage 51. The source of the n-channel transistor 64 is coupled to the second power supply terminal 68. The second magnetic element 44 is disposed between second power supply terminal 68 and ground 53 (second supply voltage).

The first magnetic element 42 is preferably programmed to a different resistance state than the second magnetic element 44. As such, an imbalance is created during power-up of the latching element 40, which causes the cross-coupled inverters to assume a desired initial state. Preferably, the first and second magnetic elements 42 and 44 are formed from a magneto-resistive structure, such as an AMR structure, a GMR structure, a CMR structure, a spin tunneling structure, a pseudo spin valve structure, or any other type of magneto-resistive structure.

It is also contemplated that a write circuit 67 may be provided for forcing the latch into an intermediate state, and for releasing the latch so that the latch can assume the state dictated by the magnetic elements 42 and 44. The write circuit 67 may include an n-channel transistor that is coupled between the input of the first inverting logic element (the output of the second inverting logic element) and the input of the second inverting logic element (the output of the first inverting logic element). When the n-channel transistor 67 is turned-on, the voltage of the inputs and outputs of the cross-coupled first and second inverting logic elements is forced to be in an intermediate state (e.g., VDD/2). When the n-channel transistor 67 is subsequently turned-off, the latch 40 assumes a desired one of two stable states, depending on the resistive states of the magnetic elements 42 and 44. The n-channel transistor 67, therefore, allows the latch 40 to be written to the state dictated by the resistive states of the magnetic elements 42 and 44 without having to power down the latch 40.

Figure 2:
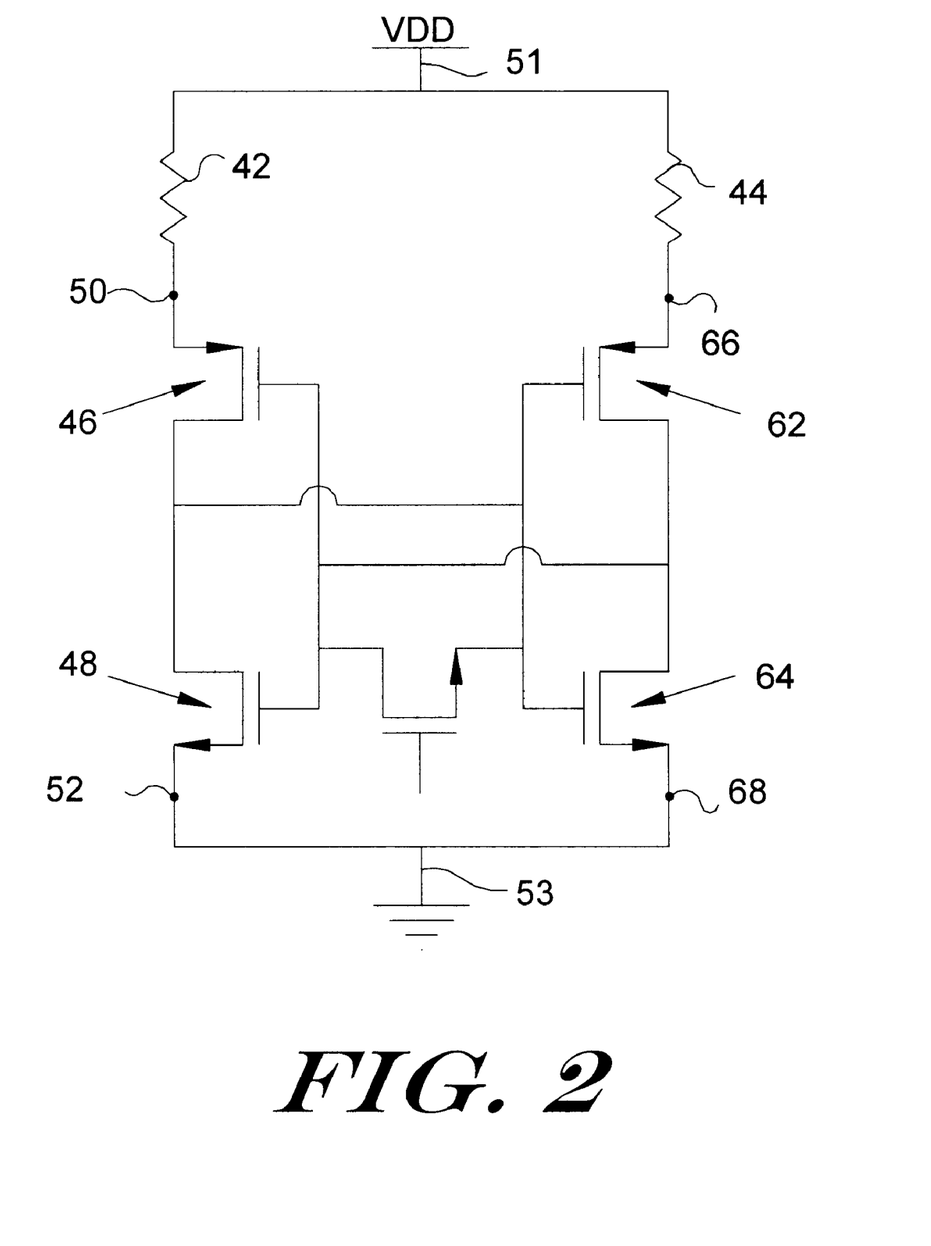
FIG. 2 is a schematic view of another latch element with two magnetic elements therein.

FIG. 2 is a schematic view of another latch with two magnetic elements 42 and 44. In this embodiment, the first magnetic element 42 is connected between the first power supply terminal 50 of the first inverter and the first supply voltage 51. The second magnetic element 44 is connected between the first power supply terminal 66 of the second inverter and the first supply voltage 51. Like the embodiment shown in FIG. 1, the first magnetic element 42 is preferably programmed to a different resistance state than the second magnetic element 44. As such, an imbalance is created during power-up of the latching element, which causes the cross-coupled inverters to assume a desired initial state.

Although not explicitly shown, it is contemplated that the first magnetic element 42 may be connected between the first power supply terminal 50 of the first inverter and the first supply voltage 51, and the second magnetic element 44 may be connected between the second power supply terminal 68 of the second inverter and ground 53. In this configuration, the first magnetic element 42 is preferably programmed to the same resistance state as the second magnetic element 44. As such, an imbalance is created during power-up of the latch, which causes the cross-coupled inverters to assume a desired initial state.

For most magneto-resistive elements, the difference in resistance between the two stable resistive states is relatively small. Because of this, variations in the transistor parameters of the n-channel transistors 48 and 64 and/or the p-channel transistors 46 and 62 of FIGS. 1–2 can significantly effect the margin of the latch in assuming the desired initial state.

For the embodiment shown in FIG. 1, the latch 40 is more sensitive to transistor parameter variations in the p-channel transistors 46 and 62 than to transistor parameter variations in the n-channel transistors 48 and 64. Variations in the transistor parameters of n-channel transistors 48 and 64 are dampened because n-channel transistors 48 and 64 have magnetic elements 42 and 44 in series with their gate-to-source voltage. In contrast, variations in the transistor parameters of p-channel transistors 46 and 62 are not dampened because p-channel transistors 46 and 62 do not have magnetic elements in series with their gate-to-source voltage.

Similarly, and referring to FIG. 2, variations in the transistor parameters of p-channel transistors 46 and 62 are dampened because p-channel transistors 46 and 62 have magnetic elements 42 and 44 in series with their gate-to-source voltage. In contrast, variations in the transistor parameters of n-channel transistors 48 and 64 are not dampened because n-channel transistors 48 and 64 do not have magnetic elements in series with their gate-to-source voltage.

Typical transistor parameter variations include differences in gate length, threshold voltage, etc. For illustrative purposes, the effect of gate length variations on the latch shown in FIG. 1 will first be discussed. Then the effect of threshold voltage variations will be discussed.

Referring to FIG. 1, we first assume that the inverse of the transconductance $(1/g_m)$ of the n-channel transistors 48 and 64 is much smaller than the resistance of the magnetic elements 42 and 44. We also assume that the resistance of magnetic element 44 is 3% smaller than the resistance of magnetic element 42, which is typical for many magneto-resistive materials. With write transistor 67 turned-on, the 3% difference in resistance of magnetic elements 42 and 44 causes the drain current of n-channel transistor 64 to be 3% larger than the drain current of n-channel transistor 48. If p-channel transistors 46 and 62 are identical, then this difference in drain current will unbalance the latch 40 in the desired way when write transistor 67 is subsequently turned-off. However, if the drain currents of p-channel transistors 46 and 62 are mismatched by more than 3% because of one or more of their transistor parameters, then the state of the latch 40 will be dominated by the transistor parameter variations, rather than the desired resistance differential of the magnetic elements 42 and 44.

Now, lets say for illustrative purposes, that the only transistor mismatch is a gate length variation in the p-channel transistors 46 and 62. Since the drain current in p-channel transistors 46 and 62 is inversely proportional to the gate length L, the gate length error that can be tolerated before the state of the latch will be dominated by the mismatch is:

$$\frac{\Delta L}{L} = \frac{\Delta R}{R} \tag{1}$$

Because we have assumed that the inverse of the transconductance of n-channel transistors 48 and 64 is much smaller than the resistance R of magnetic elements 42 and 44, the latch 40 is much less sensitive to any gate length variations in the n-channel transistors 48 and 64. More specifically, because n-channel transistors 48 and 64 have the magnetic elements 42 and 44 in series with their sources, any transconductance mismatch between n-channel transistors 48 and 64 is dominated by the resistance mismatch $\Delta R$ between the magnetic elements 42 and 44, and not variations in the transistor parameters.

Even if the transconductance $(1/g_m)$ of the n-channel transistors 48 and 64 is about the same as the resistance of the magnetic elements 42 and 44, any mismatches in drain current of n-channel transistors 48 and 64 is attenuated by about ½ by the series resistance of the corresponding magnetic elements 42 and 44. That is, a 1% change in transconductance $(1/g_m)$ in n-channel transistors 48 and 64 only results in a 0.5% change in drain current because the transconductance $(1/g_m)$ is in series with the corresponding magnetic elements 42 or 44, which has about the same resistance as the transconductance $(1/g_m)$. Therefore, the gate length error that can be tolerated in n-channel transistors 48 and 64 before the state of the latch 40 that will be dominated by the mismatch is:

$$\frac{\Delta L}{L} = \frac{1}{2}\frac{\Delta R}{R} \tag{2}$$

Therefore, even if the transconductance $(1/g_m)$ of the n-channel transistors 48 and 64 is about the same as the resistance of the magnetic elements 42 and 44, the latch 40 is twice as sensitive to gate length mismatches for the p-channel transistors 46 and 62 than for the n-channel transistors 48 and 64.

It is also illustrative to examine the effect of transistor threshold voltage $(V_T)$ variations. For the n-channel devices 48 and 64, the latch 40 will be dominated by the threshold voltage mismatch when the threshold voltage variation $\Delta V_{TN}$ equals:

$$\Delta V_{TN} = I_B \times \Delta R \tag{3}$$

For the p-channel transistors 46 and 62, the latch 40 can be dominated by the threshold voltage mismatch $\Delta V_{TP}$ required to upset the latch. To calculate the threshold voltage mismatch $\Delta V_{TP}$, we first note that the latch 40 will be dominated by a drain current mismatch $\Delta I_D$ between p-channel transistors 46 and 62 when:

$$\frac{\Delta I_D}{I_D} = \frac{\Delta R}{R} \tag{4}$$

The relation of equation (4) follows direction from equation (2). It is well known that the drain current of a p-channel transistor is given approximately by the relation:

$$I_{DP} = \beta(V_{GS} - V_{TP})^2 \tag{5}$$

Taking the derivative of $I_{DP}$ and dividing by $I_{DP}$ we get the relation:

$$\frac{\Delta I_{DP}}{I_{DP}} = \frac{2\beta(V_{GS} - V_{TP})\Delta V_{TP}}{\beta(V_{GS} - V_{TP})^2} \tag{6}$$

simplifying, we get the relation:

$$\frac{\Delta I_{DP}}{I_{DP}} = \frac{2\Delta V_{TP}}{(V_{GS} - V_{TP})} \tag{7}$$

Combining equation (7) with equation (4), we get:

$$\frac{2\Delta V_{TP}}{(V_{GS} - V_{TP})} = \frac{\Delta R}{R} \tag{8}$$

solving for $\Delta V_{TP}$, we get:

$$\Delta V_{TP} = \frac{1}{2}\frac{\Delta R}{R}(V_{GS} - V_{TP}) \quad (9)$$

From equations (3) and (9), it is evident that the n-channel transistor sensitivity is only dependent on the current in the balanced condition $I_B$ and the percentage change in resistance $\Delta R$ of the magnetic elements 42 and 44, but the p-channel sensitivity is proportional to one-half of the ratio $\Delta R/R$ times the voltage $V_{GS}-V_{TP}$. Since the term $V_{GS}-V_{TP}$ gets smaller as the supply voltage decreases, the p-channel sensitivity gets worse as the supply voltage decreases. Therefore, particularly for those circuits with lower supply voltages and low currents, the p-channel sensitivity can exceed the n-channel sensitivity. A similar analysis can be provided for the embodiment shown in FIG. 2, except now the latch is more sensitive to variations in the n-channel transistor parameters. In other words, the circuit is more sensitive to transistor parameter variations when no magnetic elements are placed in series with the transistors.

Figure 3:
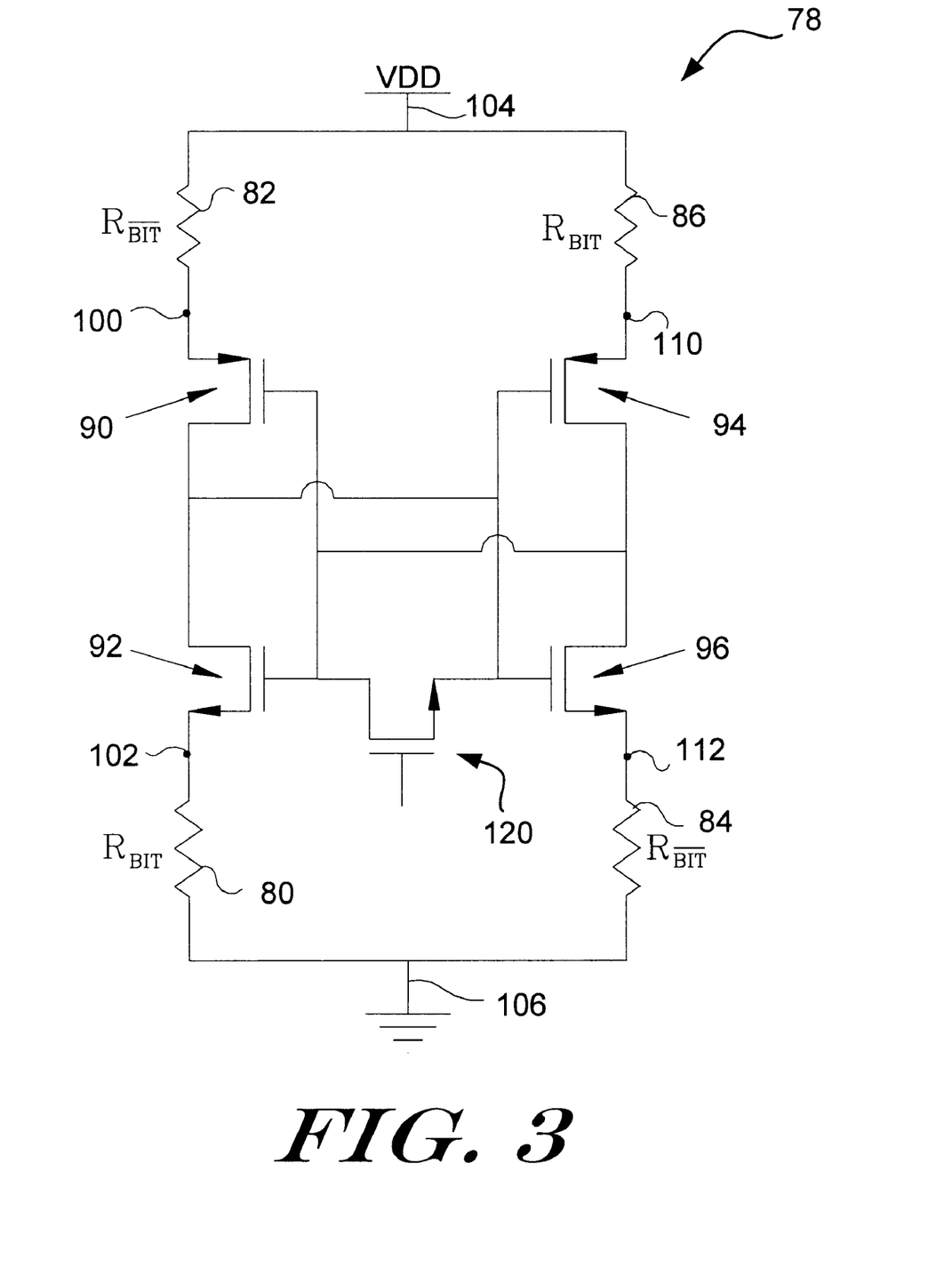
FIG. 3 is a schematic view of a latch element having four magnetic elements therein.

To minimize the effect of transistor parameter variations, the present invention contemplates providing magnetic elements in series with both the n-channel transistors and the p-channel transistors, as shown in FIG. 3.

FIG. 3 is a schematic view of a latch element 78 with a first magnetic element 80, a second magnetic element 82, a third magnetic element 84 and a fourth magnetic element 86. Like the embodiments of FIG. 1 and FIG. 2, the latching element 78 preferably includes a first inverter having p-channel transistor 90 and n-channel transistor 92, and a second inverter having p-channel transistor 94 and n-channel transistor 96. The first inverter and the second inverter are coupled together in a well-known cross-coupled configuration as shown.

The first inverter has a first power supply terminal 100 and a second power supply terminal 102. The source of the n-channel transistor 92 is coupled to the second power supply terminal 102, and the source of the p-channel transistor 90 is coupled to the first power supply terminal 100. The first magnetic element 80 is disposed between the second power supply terminal 102 and ground 106 (the second supply voltage). The second magnetic element 82 is disposed between the first power supply terminal 100 and the first supply voltage 104.

Likewise, the second inverter has a first power supply terminal 110 and a second power supply terminal 112. The source of the n-channel transistor 96 is coupled to the second power supply terminal 112, and the source of the p-channel transistor 94 is coupled to the first power supply terminal 110. The third magnetic element 84 is disposed between the second power supply terminal 112 and ground 106 (the second supply voltage). The second magnetic element 86 is disposed between the first power supply terminal 110 and the first supply voltage 104.

The first and fourth magnetic elements 80 and 86 are preferably programmed to one of the two stable resistive states, and the second and third magnetic elements 82 and 84 are preferably programmed to the other one of the two stable resistive states. This creates an imbalance in the latch 78 during power-up, which causes the cross-coupled inverters to assume a desired initial state. It is contemplated that the cross-coupled inverters may be fabricated using discrete logic or integrated logic, including any number of integrated circuit technologies including BIPOLAR, CMOS, BICMOS, etc.

It is also contemplated that a write circuit 120 may be provided for forcing the latch 78 into an intermediate state, and for releasing the latch 78 so that the latch 78 can assume the state dictated by the magnetic elements 80, 82, 84 and 86. The write circuit 120 may include an n-channel transistor that is coupled between the input of the first inverting logic element (the output of the second inverting logic element) and the input of the second inverting logic element (the output of the first inverting logic element). When the n-channel transistor 120 is turned-on, the voltage of the inputs and outputs of the cross-coupled first and second inverting logic elements is forced to be in an intermediate state (e.g., VDD/2). When the n-channel transistor 120 is subsequently turned-off, the latch 78 assumes a desired one of two stable states, depending on the resistive states of the magnetic elements 80, 82, 84 and 86. The n-channel transistor 120, therefore, allows the latch 78 to be written to the state dictated by the resistive states of the magnetic elements 80, 82, 84 and 86 without having to power down the latch 78.

Figure 4:
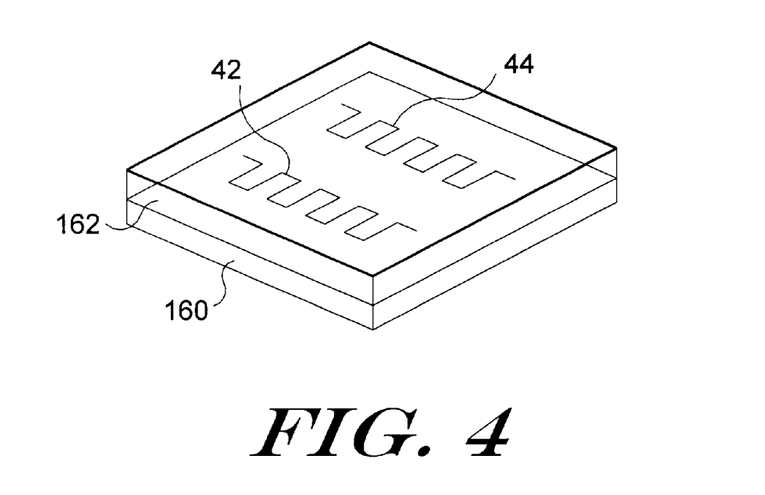
FIG. 4 is a partial perspective view of a latch element having two magnetic elements disposed above the electronic circuitry.

FIG. 4 is a partial perspective view of a latching element having electronic circuitry 160 and two magnetic elements 42 and 44 disposed above the electronic circuitry 160. Each of the magnetic elements 42 and 44 may be constructed from two or more magnetically programmable elements connected in a series configuration, as shown. The individual magnetically programmable elements may be connected together using a non-magnetic material.

The electronic circuitry 160 preferably includes selected metal interconnect layers, vias and contacts necessary to interconnect the electronic circuitry to the magnetic elements 42 and 44. By providing the magnetic elements after contact and via processing, higher densities may be achieved as disclosed in commonly assigned U.S. patent application Ser. No. 08/993,005, filed Dec. 18, 1997, entitled "High Density Magnetic Memory Device and Method of Manufacture Therefor", which is incorporated herein by reference.

Figure 5:
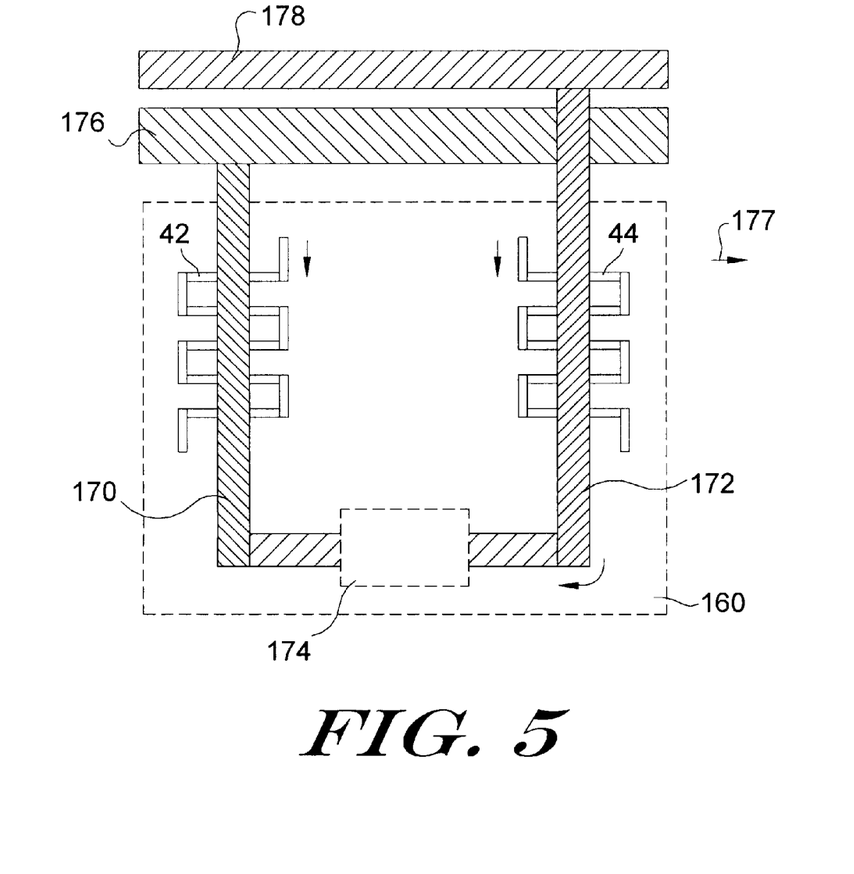
FIG. 5 is a schematic view of a latch with illustrative write lines overlaying selected magnetic elements.

FIG. 5 is a schematic view of a magnetic latching element, having illustrative write lines overlaying the magnetic elements 42 and 44. The electronic circuitry 160 is shown in phantom below the magnetic elements. As indicated above with reference to FIGS. 1–3, the magnetic elements 42 and 44 are preferably programmed to a desired state. In some embodiments, it is desirable to program the magnetic elements 42 and 44 into the same state, while in other embodiments it is desirable to program the magnetic elements 42 and 44 into opposite states.

Most magneto-resistive memory elements can be written into one of two states. This is typically done by providing a write line adjacent to the magnetic elements, and passing a write current through the write line. The write current produces a magnetic field, which intersects the magnetic element in one of two directions. If the magnetic field intersects the magnetic element in a first direction, the magnetic element is written into a first state. If the magnetic field intersects the magnetic element in a second direction, the magnetic element is written into a second state.

Referring specifically to FIG. 5, a first write line 170 is provided over the first magnetic element 42, and a second write line 172 is provided over the second magnetic element 44. A phantom box is shown at 174, which may represent different functions depending on the desired writing scheme. In one embodiment, the phantom box 174 simply connects the first write line 170 and the second write line 172. As such, a write current I, can be passed down the first write line 172 and back the second write line 174. Assuming the first magnetic element 42 and the second magnetic element 44 each have hard layers that are magnetized in the same direction, for example from left to right as shown at 177, the write current I writes a first resistive state to the first magnetic element 42 and an opposite resistive state to the second magnetic element 44. The direction of the write current can be reversed to reverse the state written to the first and second magnetic elements 42 and 44. A similar approach may be provided for the embodiment shown in FIG. 3, with the first write line extending adjacent the first magnetic element 80 and fourth magnetic element 86, and the second write line 172 extending adjacent the second magnetic element 82 and third magnetic element 84. Alternatively, a single write line may be provided that passes adjacent the first, second, third and fourth magnetic elements 80, 82, 84 and 86, with the single write line passing above the first and fourth magnetic elements 80 and 86 and below the second and third magnetic elements 82 and 84, or visa-versa.

In another embodiment, the phantom box 174 may either directly or indirectly connect the first write line 170 and the second write line 172 to a predetermined voltage such as ground. In this embodiment, the first write line 170 and the second write line 172 independently control the write state of the first and second magnetic elements 42 and 44, respectively.

In yet another embodiment, the phantom box 174 may include logic or the like to help control the writing of the first and second magnetic elements 42 and 44. For example, the phantom box 174 may include a switch that selectively connects the first write line 170 and the second write line. This may be particularly useful when the first write signal 176 and the second write signal 178 service more than one latching element. The switch may provide a degree of control over which of the latching elements are written during a particular write cycle. Numerous other writing schemes are also contemplated, including those described in co-pending U.S. patent application Ser. No. 09/059,871, filed Apr. 14, 1998, entitled "Non-Volatile Storage Latch", the entire disclosure of which is incorporated herein by reference.

Having thus described the preferred embodiments of the present invention, those of skill in the art will readily appreciate that the teachings found herein may be applied to yet other embodiments within the scope of the claims hereto attached.

What is claimed is:

1. A non-volatile latch having a first supply terminal and a second supply terminal, the non-volatile latch comprising:
a latching element having a first inverting logic element and a second inverting logic element coupled together in a cross-coupled configuration, wherein each of the first and second inverting logic elements has a power supply terminal and a ground terminal;
first magnetic means for providing a first magnetically programmable resistance value, the first magnetic means connected between the power supply terminal of the first inverting logic element and the first supply terminal of the latch;
second magnetic means for providing a second magnetically programmable resistance value, the second magnetic means connected between the ground terminal of the first inverting logic element and the second supply terminal of the latch;
third magnetic means for providing a third magnetically programmable resistance value, the third magnetic means connected between the power supply terminal of the second inverting logic element and the first supply terminal of the latch; and
fourth magnetic means for providing a fourth magnetically programmable resistance value, the fourth magnetic means connected between the ground terminal of the second inverting logic element and the second supply terminal of the latch.

2. A non-volatile latch according to claim 1, wherein the magnetically programmable resistance value of each of the first magnetic means, the second magnetic means, the third magnetic means and the fourth magnetic means has two stable states.

3. A non-volatile latch according to claim 2, wherein the magnetically programmable resistance value of the first and fourth magnetic means is in one of the two stable states, and the magnetically programmable resistance value of the second and third magnetic means is in the other one of the two stable states.

4. A non-volatile latch according to claim 3, wherein the first inverting logic element has an input and an output, and the second inverting logic element has an input and an output, the output of the first inverting logic element is coupled to the input of the second inverting logic element, and the output of the second inverting logic element is coupled to the input of the first inverting logic element.

5. A non-volatile latch according to claim 4, further comprising:
means for selectively connecting the input of the first inverting logic element to the output of the first inverting logic element, and therefore the output of the second inverting logic element to the input of the second inverting logic element.

6. A non-volatile latch according to claim 5, wherein the connecting means includes a transistor having a source, drain and gate, the source of the transistor is connected to the input of the first inverting logic element, the drain of the transistor is connected to the output of the first inverting logic element, and the gate of the transistor is coupled to an input terminal.

7. A non-volatile latch according to claim 3, wherein each of the first, second, third and fourth magnetic means comprises an AMR material.

8. A non-volatile latch according to claim 3, wherein each of the first, second, third and fourth magnetic means comprises a GMR material.

9. A non-volatile latch according to claim 3, wherein each of the first, second, third and fourth magnetic means comprises a CMR material.

10. A non-volatile latch according to claim 3, wherein each of the first, second, third and fourth magnetic means comprises a spin tunneling element.

11. A non-volatile latch according to claim 3, wherein each of the first, second, third and fourth magnetic means comprises a pseudo spin valve element.

12. A non-volatile latch according to claim 3, wherein each of the first, second, third and fourth magnetic means includes two or more magnetically programmable elements connected in series.

13. A non-volatile latch according to claim 12, wherein two or more magnetically programmable elements of each of the first, second, third and fourth magnetic means are connected together with a non-magnetic material.

14. A non-volatile latch according to claim 3, further comprising a write line, wherein the write line passes adjacent the first, second, third and fourth magnetic means.

15. A non-volatile latch according to claim 14, wherein the write line passes above the first and fourth magnetic means and below the second and third magnetic means.

16. A non-volatile latch according to claim 3, further comprising a first write line and a second write line, wherein the first write line passes adjacent the first and fourth magnetic means, and the second write line passes adjacent the second and third magnetic means.

17. A non-volatile latch powered by a first voltage and a second voltage, comprising:

a first p-channel transistor having a gate terminal, a source terminal and a drain terminal;

a first n-channel transistor having a gate terminal, a source terminal and a drain terminal, the drain terminal of the first n-channel transistor is connected to the drain terminal of the first p-channel transistor, and the gate terminal of the first n-channel transistor is connected to the gate terminal of the first p-channel transistor;

a second p-channel transistor having a gate terminal, a source terminal and a drain terminal;

a second n-channel transistor having a gate terminal, a source terminal and a drain terminal, the drain terminal of the second n-channel transistor is connected to the drain terminal of the second p-channel transistor, and the gate terminal of the second n-channel transistor is connected to the gate terminal of the second p-channel transistor;

the drain terminal of the first n-channel transistor is connected to the gate terminal of the second n-channel transistor, and the drain terminal of the second n-channel transistor is connected to the gate terminal of the first n-channel transistor;

a first magnetic means for providing a first magnetically programmable resistance value connected between the source of the first p-channel transistor and the first voltage;

a second magnetic means for providing a second magnetically programmable resistance value connected between the source of the first n-channel transistor and the second voltage;

a third magnetic means for providing a third magnetically programmable resistance value connected between the source of the second p-channel transistor and the first voltage; and a fourth magnetic means for providing a fourth magnetically programmable resistance value connected between the source of the second n-channel transistor and the second voltage.

18. A non-volatile latch according to claim 17, wherein the magnetically programmable resistance value of each of the first magnetic means, the second magnetic means, the third magnetic means and the fourth magnetic means has two stable states.

19. A non-volatile latch according to claim 18, wherein the magnetically programmable resistance value of the first and fourth magnetic means is in one of the two stable states, and the magnetically programmable resistance value of the second and third magnetic means is in the other one of the two stable states.

20. A non-volatile latch according to claim 19, further comprising:

means for selectively connecting the gate of the first n-channel transistor to the gate of the second n-channel transistor.

21. A non-volatile latch according to claim 20, wherein the connecting means includes a transistor having a source, drain and gate, the source of the transistor is connected to the gate of the first n-channel transistor, the drain of the transistor is connected to the gate of the second n-channel transistor, and the gate of the transistor is coupled to an input terminal.

22. A non-volatile latch according to claim 21, wherein the transistor is an n-channel transistor.

23. A non-volatile latch according to claim 17, wherein each of the first, second, third and fourth magnetic means comprises a material selected from the group consisting of an AMR material, a GMR material and a CMR material.

24. A non-volatile latch powered by a first voltage and a second voltage, comprising:

a first p-channel transistor having a gate terminal, a source terminal and a drain terminal;

a first n-channel transistor having a gate terminal, a source terminal and a drain terminal, the drain terminal of the first n-channel transistor is connected to the drain terminal of the first p-channel transistor, and the gate terminal of the first n-channel transistor is connected to the gate terminal of the first p-channel transistor;

a second p-channel transistor having a gate terminal, a source terminal and a drain terminal;

a second n-channel transistor having a gate terminal, a source terminal and a drain terminal, the drain terminal of the second n-channel transistor is connected to the drain terminal of the second p-channel transistor, and the gate terminal of the second n-channel transistor is connected to the gate terminal of the second p-channel transistor;

the drain terminal of the first n-channel transistor is connected to the gate terminal of the second n-channel transistor, and the drain terminal of the second n-channel transistor is connected to the gate terminal of the first n-channel transistor;

a third n-channel transistor having a source, a drain and a gate, the source of the third n-channel transistor is connected to the gate of the first n-channel transistor, the drain of the third n-channel transistor is connected to the gate of the second n-channel transistor, and the gate of the third n-channel transistor is coupled to an input terminal;

a first magnetic means for providing a first magnetically programmable resistance value connected between the source of the first p-channel transistor and the first voltage;

a second magnetic means for providing a second magnetically programmable resistance value connected between the source of the first n-channel transistor and the second voltage;

a third magnetic means for providing a third magnetically programmable resistance value connected between the source of the second p-channel transistor and the first voltage;

a fourth magnetic means for providing a fourth magnetically programmable resistance value connected between the source of the second n-channel transistor and the second voltage; and the magnetically programmable resistance value of each of the first magnetic means, the second magnetic means, the third magnetic means and the fourth magnetic means having two stable states, wherein the magnetically programmable resistance value of the first and fourth magnetic means is in one of the two stable states, and the magnetically programmable resistance value of the second and third magnetic means is in the other one of the two stable states.

* * * * *